(12) United States Patent
Jeon et al.

(10) Patent No.: US 9,306,544 B2
(45) Date of Patent: Apr. 5, 2016

(54) ELECTRONIC DEVICE INCLUDING TRANSISTOR AND METHOD OF OPERATING THE SAME

(71) Applicant: Samsung Electronics Co., Ltd., Suwon-Si, Gyeonggi-Do (KR)

(72) Inventors: Woo-chul Jeon, Daegu (KR); Ki-yeol Park, Suwon-si (KR); Young-hwan Park, Seoul (KR); Jai-kwang Shin, Anyang-si (KR); Jae-joon Oh, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 12 days.

(21) Appl. No.: 13/789,884

(22) Filed: Mar. 8, 2013

(65) Prior Publication Data

US 2014/0049296 A1 Feb. 20, 2014

(30) Foreign Application Priority Data

Aug. 16, 2012 (KR) .................. 10-2012-0089672

(51) Int. Cl.
*H03B 1/00* (2006.01)
*H03K 3/012* (2006.01)
*H03K 17/687* (2006.01)

(52) U.S. Cl.
CPC ............ *H03K 3/012* (2013.01); *H03K 17/6871* (2013.01); *H03K 2017/6875* (2013.01)

(58) Field of Classification Search
CPC ........... H01L 29/2003; H01L 33/0079; H03K 17/04126; H03K 17/03; H03K 2217/0036; H03K 17/601; H03K 17/0826

USPC ................... 257/76, 190, 194, 195, E29.246; 327/108–112
See application file for complete search history.

(56) References Cited

U.S. PATENT DOCUMENTS

| 4,783,693 A | * | 11/1988 | Alzati et al. .................. 257/477 |
| 6,177,057 B1 | * | 1/2001 | Purdy ........................... 423/409 |
| 7,501,670 B2 | | 3/2009 | Murphy | |
| 7,825,435 B2 | | 11/2010 | Machida et al. | |
| 2008/0197908 A1 | * | 8/2008 | Williams ...................... 327/431 |
| 2008/0230784 A1 | | 9/2008 | Murphy | |
| 2010/0019279 A1 | | 1/2010 | Chen et al. | |
| 2010/0117095 A1 | | 5/2010 | Zhang | |
| 2011/0057196 A1 | | 3/2011 | Chang et al. | |
| 2011/0210337 A1 | | 9/2011 | Briere | |

(Continued)

FOREIGN PATENT DOCUMENTS

| JP | 2008053436 A | 3/2008 |
| KR | 2005-0053992 A | 6/2005 |
| KR | 2007-0113094 A | 11/2007 |

*Primary Examiner* — Diana J Cheng
(74) *Attorney, Agent, or Firm* — Harness, Dickey & Pierce, P.L.C.

(57) ABSTRACT

An electronic device may include a first transistor having a normally-on characteristic; a second transistor connected to the first transistor and having a normally-off characteristic; a constant voltage application unit configured to apply a constant voltage to a gate of the first transistor; and a switching unit configured to apply a switching signal to the second transistor. The first transistor may be a high electron mobility transistor (HEMT). The second transistor may be a field-effect transistor (FET). The constant voltage application unit may include a diode connected to the gate of the first transistor; and a constant current source connected to the diode.

36 Claims, 5 Drawing Sheets

(56) References Cited

U.S. PATENT DOCUMENTS

| | | | |
|---|---|---|---|
| 2012/0056648 A1* | 3/2012 | Iwabuchi et al. | 327/109 |
| 2012/0217937 A1* | 8/2012 | Miyauchi et al. | 322/28 |
| 2012/0280271 A1* | 11/2012 | Ichikawa | 257/133 |
| 2013/0234208 A1* | 9/2013 | Bramian et al. | 257/195 |

\* cited by examiner

ELECTRONIC DEVICE INCLUDING TRANSISTOR AND METHOD OF OPERATING THE SAME

CROSS-REFERENCE TO RELATED APPLICATIONS

This application claims priority under 35 U.S.C. §119 to Korean Patent Application No. 10-2012-0089672, filed on Aug. 16, 2012, in the Korean Intellectual Property Office, the disclosure of which is incorporated herein in its entirety by reference.

BACKGROUND

1. Field

The present disclosure relates to electronic devices including transistors and/or methods of operating the electronic devices.

2. Description of the Related Art

Various power conversion systems include a device for controlling flow of an electric current through ON/OFF switching operations such as a power device. In a power conversion system, an efficiency of the entire system may depend on an efficiency of a power device.

Power devices that are currently commercialized are mostly power metal-oxide-semiconductor field-effect transistors (MOSFETs) or insulated gate bipolar transistors (IGBTs) which are based on silicon (Si). However, it is difficult to increase an efficiency of the power device based on silicon due to limitations in physical properties of the silicon and in manufacturing processes. To overcome the above limitations, research for increasing conversion efficiency by applying group III-V based compound semiconductor to a power device is being conducted. As a result, high electron mobility transistors (HEMTs) using a heterojunction structure of compound semiconductors have drawn attention.

However, HEMTs generally have normally-on characteristics, which may increase power consumption and make it difficult to improve/adjust characteristics of electronic devices to which HEMTs are applied.

SUMMARY

Provided are electronic devices having excellent performance and operating characteristics, the electronic devices including transistors such as high electron mobility transistors (HEMTs).

Provided are electronic devices having low on-resistance, the electronic devices including transistors such as HEMTs.

Provided are methods of operating the electronic devices.

Additional aspects will be set forth in part in the description which follows and, in part, will be apparent from the description, or may be learned by practice of example embodiments.

According to example embodiments, an electronic device includes: a first transistor having a normally-on characteristic; a second transistor connected to the first transistor, the second transistor having a normally-off characteristic; a constant voltage application unit configured to apply a constant voltage to a gate of the first transistor; and a switching unit configured to apply a switching signal to the second transistor.

In example embodiments, the first transistor may be a high electron mobility transistor (HEMT).

In example embodiments, the first transistor may be a nitride based HEMT.

In example embodiments, the nitride may include a gallium nitride based material.

In example embodiments, the second transistor may be a field-effect transistor (FET).

In example embodiments, the second transistor may be a metal-oxide-semiconductor field-effect transistor (MOSFET).

In example embodiments, the second transistor may be a silicon (Si) based MOSFET.

In example embodiments, the first transistor and the second transistor may be connected to each other in a cascode configuration.

In example embodiments, the constant voltage application unit may include: a constant current source connected to the gate of the first transistor; and a diode connected between the constant current source and the gate of the first transistor.

In example embodiments, an anode of the diode may be connected to the gate of the first transistor, and a cathode of the diode may be connected to a source of the second transistor.

In example embodiments, the diode may be a Schottky diode.

In example embodiments, the diode may include the same semiconductor material as the semiconductor material of the first transistor.

In example embodiments, the diode may include a gallium nitride based material.

In example embodiments, the electronic device may further include a substrate and diode and the first transistor may be on the substrate.

In example embodiments, the first transistor may include: a first semiconductor layer formed of a first semiconductor material on the substrate; a second semiconductor layer on a first region of the first semiconductor layer and formed of a second semiconductor material that induces a two-dimensional electron gas (2DEG) in the first semiconductor layer; the gate on the second semiconductor layer; and a source and a drain at both sides of the gate.

In example embodiments, the diode may include a third semiconductor layer on a second region of the first semiconductor layer and formed of the second semiconductor material; an anode forming a Schottky contact with the third semiconductor layer; and a cathode spaced apart from the anode.

In example embodiments, the constant voltage application unit may include a plurality of diodes. The plurality of diodes of the constant voltage application unit may be connected between the constant current source of the constant voltage application unit and the gate of the first transistor.

In example embodiments, the electronic device may include a semiconductor device part and a driving circuit part.

In example embodiments, the semiconductor device part may include the first and second transistors, and the driving circuit part may include the switching unit and at least a portion of the constant voltage application unit.

In example embodiments, the constant voltage application unit may include a constant current source and a diode and the constant current source may be included in the driving circuit part, and the diode may be included in the semiconductor device part. Alternatively, the constant current source and the diode may be included in the driving circuit part.

According to example embodiments, a power device includes the electronic device.

According to example embodiments, an electronic device includes a HEMT having a normally-on characteristic; a FET connected to the HEMT, the FET having a normally-off characteristic; a diode connected to a gate of the HEMT; a constant current source connected to the diode; and a switching unit configured to apply a switching signal to the FET.

In example embodiments, the HEMT may include a gallium nitride based material.

In example embodiments, the diode may include a gallium nitride based material.

In example embodiments, the electronic device may further include a substrate. The HEMT and the diode may be f on the substrate.

In example embodiments, the FET may be a silicon (Si) based MOSFET.

In example embodiments, the HEMT and the FET may be connected to each other in a cascode configuration.

According to example embodiments, a power device includes the electronic device.

According to example embodiments, a method of operating an electronic device including a first transistor having a normally-on characteristic and a second transistor connected to the first transistor and having a normally-off characteristic, the method including: applying a constant voltage to a gate of the first transistor so as to increase a voltage between the gate and a source of the first transistor; and applying a switching signal to the second transistor while the constant voltage is applied to the gate of the first transistor.

In example embodiments, the electronic device may further include a constant current source connected to the gate of the first transistor and a diode connected between the constant current source and the gate of the first transistor. The applying the constant voltage may include applying the constant voltage to the gate of the first transistor by using the constant current source and the diode.

In example embodiments, the anode of the diode may be connected to the gate of the first transistor and a cathode of the diode may be connected to a source of the second transistor.

In example embodiments, the diode may be a Schottky diode.

In example embodiments, the first transistor may be a HEMT.

In example embodiments, the second transistor may be a FET.

In example embodiments, the second transistor may be a MOSFET.

In example embodiments, the first transistor and the second transistor may be connected to each other in a cascode configuration.

According to example embodiments, an electronic device includes: a first transistor connected to a second transistor, and a driving circuit. The first transistor has a normally-on characteristic, and the second transistor has a normally-off characteristic. The driving circuit is configured to apply a constant voltage to a gate of the first transistor. The driving circuit is configured to apply a switching signal to a gate of the second transistor.

In example embodiments, the first transistor may be a high electron mobility transistor (HEMT), the second transistor may be a metal-oxide semiconductor field-effect transistor (MOSFET), and the first transistor and the second transistor may be connected to each other in a cascode configuration.

In example embodiments, the driving circuit may include a constant current source that is connected to an anode of a diode and a gate of the first transistor, a cathode of the diode may be connected to a source of the second transistor, and the driving circuit may further include a switching unit that is connected to a gate of the second transistor.

In example embodiments, the diode and the first transistor may be on a common substrate.

In example embodiments, the diode may be a Schottky diode.

BRIEF DESCRIPTION OF THE DRAWINGS

These and/or other aspects will become apparent and more readily appreciated from the following description of non-limiting example embodiments, taken in conjunction with the accompanying drawings in which.

DETAILED DESCRIPTION

Figure 1:
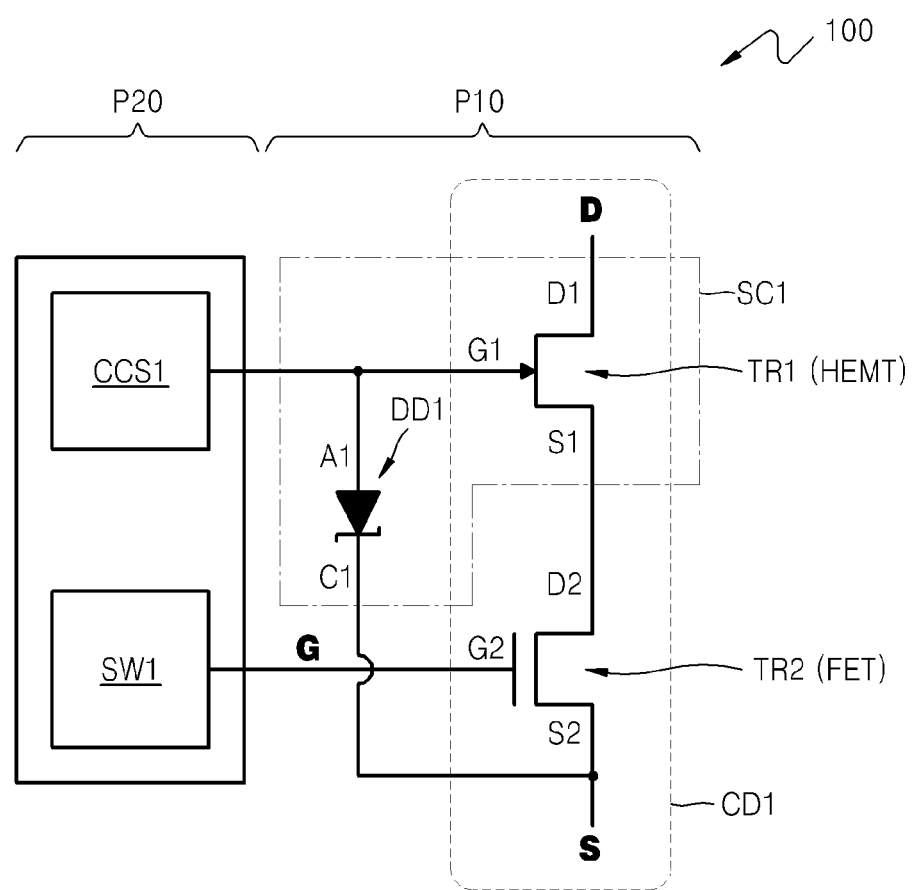
FIG. 1 is a circuit diagram of an electronic device according to example embodiments.

Various example embodiments will now be described more fully with reference to the accompanying drawings in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of some example embodiments and intermediate structures of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments will now be described more fully with reference to the accompanying drawings. In the drawings, the same reference numerals denote the same elements, and the width and thicknesses of layers and regions may be exaggerated for clarity.

FIG. 1 is a circuit diagram of an electronic device 100 according to example embodiments.

Referring to FIG. 1, the electronic device 100 may include a first transistor TR1 and a second transistor TR2 connected to the first transistor TR1. The first transistor TR1 may have a normally-on characteristic. This may mean that the first transistor TR1 is a depletion mode (D-mode) transistor. The first transistor TR1 may be a high electron mobility transistor (HEMT). For example, the first transistor TR1 may be a nitride based HEMT. Nitride may be a gallium nitride based material. For example, the first transistor TR1 may be a GaN based HEMT; however, example embodiments are not limited thereto. A breakdown voltage Vbd of the first transistor TR1 may be higher than several hundreds volts V, for example, higher than about 700 V, and a drain current Ids thereof may be higher than about 10 A. However, the breakdown voltage Vbd and the drain current Ids may vary.

The second transistor TR2 may have a normally-off characteristic. This may mean that the second transistor TR2 is an enhancement mode (E-mode) transistor. The second transistor TR2 may be a field-effect transistor (FET). For example, the second transistor TR2 may be a metal-oxide-semiconductor FET (MOSFET). More specifically, the second transistor TR2 may be a silicon (Si) based power MOSFET. The breakdown voltage Vbd of the second transistor TR2 may be below about 50 V, for example, between about 20 V and about 30 V, the drain current Ids thereof may be higher than about 10 A, and an on-resistance Ron thereof may be below about 10 mΩ. However, the breakdown voltage Vbd, the drain current Ids, and the on-resistance Ron may vary.

The second transistor TR2 having the normally-off characteristic is connected to the first transistor TR1 having the normally-on characteristic so that the first transistor TR1 may be used like a normally-off device. In other words, although the first transistor TR1 has the normally-on characteristic, a device CD1 in which the first transistor TR1 and the second transistor TR2 are connected to each other may have the normally-off characteristic due to the second transistor TR2. To solve a normally-on problem, which is a disadvantage of some HEMTs (for example, TR1), the FET (MOSFET) having the normally-off characteristic (for example, TR2) may be connected to the HEMT so that the HEMT may be used like a normally-off device.

The first transistor TR1 and the second transistor TR2 may be connected to each other in a cascode configuration. If a source, a drain, and a gate of the first transistor TR1 denote S1, D1, and G1, respectively, and a source, a drain, and a gate of the second transistor TR2 denote S2, D2, and G2, respectively, the drain D2 of the second transistor TR2 may be connected to the source S1 of the first transistor TR1. If the first transistor TR1 and the second transistor TR2 are connected in the cascode configuration, the device CD1 including the first transistor TR1 and the second transistor TR2 may be a "cascode device". Hereinafter, the device CD1 is referred to as a cascode device CD1.

A device in which the first transistor TR1 and the second transistor TR2 are connected to each other, e.g., such as the cascode device CD1, may operate like a single transistor. A source, a drain, and a gate of the cascode device CD1 may denote S2, D1, and G2, respectively. For example, the source S2 of the second transistor TR2, the drain D1 of the first transistor TR1, and the gate G2 of the second transistor TR2 may be used as the source, the drain, and the gate of the cascode device CD1, respectively. For descriptive convenience, the source, the drain, and the gate of the cascode device CD1 denote S, D, and G, respectively. The source S, the drain D, and the gate G of the cascode device CD1 may correspond to the source S2 of the second transistor TR2, the drain D1 of the first transistor TR1, and the gate G2 of the second transistor TR2.

If the second transistor TR2 is turned on, the cascode device CD1 is regarded as turned on. Because the first transistor TR1 having the normally-on characteristic, the second transistor TR2 having the normally-off characteristic determines whether to turn on or off the cascode device CD1. Thus, a threshold voltage of the cascode device CD1 may be determined by the second transistor TR2. In other words, the threshold voltage of the cascode device CD1 may be identical or quite similar to a threshold voltage of the second transistor TR2. If the second transistor TR2 is turned on, and a desired voltage is applied between the drain D1 of the first transistor TR1 and the source S2 of the second transistor TR2, a desired or given current may flow from the drain D1 to the source S2. Another characteristic other than the threshold voltage, for example a withstand voltage characteristic or a reverse direction characteristic, may be mainly determined by the first transistor TR1. If the first transistor TR1 is the HEMT, excellent withstand voltage characteristic and reverse direction characteristic may be secured.

The electronic device 100 may further include a "constant voltage application unit" that applies a constant voltage to the gate G1 of the first transistor TR1. The constant voltage application unit may include, for example, a constant current source CCS1 and a diode DD1. The constant current source CCS1 may be connected to the gate G1 of the first transistor TR1, and the diode DD1 may be connected between the constant current source CCS1 and the gate G1 of the first transistor TR1. The diode DD1 may be regarded as connected to the gate G1 of the first transistor TR1, and the constant current source CCS1 may be regarded as connected between the diode DD1 and the gate G1 of the first transistor TR1. An anode A1 of the diode DD1 may be connected to the gate G1 of the first transistor TR1. A cathode C1 of the diode DD1 may be connected to the source S2 of the second transistor TR2.

The "constant voltage" may be applied to the gate G1 of the first transistor TR1 by using the constant current source CCS1 and the diode DD1. The constant voltage may correspond to a turn-on voltage of the diode DD1. If a desired constant current is applied to the diode DD1 by using the constant current source CCS1, the diode DD1 is turned on and the constant voltage corresponding to the turn-on voltage of the diode DD1 may be applied to the gate G1 of the first transistor TR1. The turn-on voltage may correspond to a forward direction voltage drop of the diode DD1, and thus a constant voltage corresponding to the forward direction voltage drop may be applied to the gate G1 of the first transistor TR1. The turn-on voltage (or the forward direction voltage drop) of the diode DD1 may be, for example, between about 1 V and about 2 V or between about 1 V and about 1.5 V, so that a voltage (the constant voltage) between about 1 V and about 2 V or between about 1 V and about 1.5 V may be constantly applied to the gate G1 of the first transistor TR1. Thus, a voltage between the gate G1 and the source S1 of the first transistor TR1, e.g., Vgs, may increase as much as the constant voltage. As a result, when the cascode device CD1 is turned on, since the voltage Vgs of the first transistor TR1 is high, an on-resistance of the first transistor TR1 may be reduced, and accordingly, performance and operating characteristic of the cascode device CD1 may be improved.

If the constant voltage application unit, for example the constant current source CCS1 and the diode DD1, is not used, when the cascode device CD1 is turned on, since the voltage Vgs of the first transistor TR1 has a minus (−) value close to zero volts (0 V), the on-resistance of the first transistor TR1 may increase, and accordingly, performance and operating characteristics of the cascade device CD1 may deteriorate.

The diode DD1 may be, for example, a Schottky diode, e.g., such as a Schottky barrier diode (SBD). The diode DD1 may include a given semiconductor layer and an electrode (an anode) that forms a Schottky contact with the given semiconductor layer. The given semiconductor layer of the diode DD1 may include the same material as a semiconductor material of the first transistor TR1. For example, the diode DD1 may include a nitride based semiconductor layer. The nitride may be a gallium nitride based material. The diode DD1 and the first transistor TR1 may be formed on the same substrate. For example, the first transistor TR1 may be formed on a desired substrate, and the diode DD1 may also be formed on the desired substrate together with the first transistor TR1. The diode DD1 and the first transistor TR1 may be configured as a single chip SC1, and an additional process load due to the formation of the diode DD1 may be reduced. However, the diode DD1 and the first transistor TR1 may be formed on different substrates.

The diode DD1 has a small size and a small current necessary for turning on the diode DD1, which minimally affects power consumption of an overall device, such as the electronic device 100. In particular, if the diode DD1 is a gallium nitride based Schottky diode, since the current necessary for turning on the diode DD1 is below 1 mA, although the current necessary for turning on the diode DD1 is continuously applied from the constant current source CCS1, the entire amount of power consumption may hardly be affected.

The electronic device 100 may further include a switching unit SW1 that applies a switching signal to the second transistor TR2. The switching unit SW1 may be connected to the gate G2 of the second transistor TR2. The switching unit SW1 may be used to apply a desired switching signal (for example, a pulse form voltage signal) to the gate G2 of the second transistor TR2 and turn on (or turn off) the second transistor TR2. For example, the cascode device CD1 may be turned on (or turned off) by turning on (or turning off) the second transistor TR2. The configuration of the switching unit SW1 is well known, and thus a detailed description thereof is omitted.

The electronic device 100 of FIG. 1 may include a semiconductor device part P10 and a driving circuit part P20 for driving the semiconductor device part P10. The semiconductor device part P10 may include the first transistor TR1 and the second transistor TR2. The semiconductor device part P10 may further include the diode DD1. The driving circuit part P20 may include the constant current source CCS1 and the switching unit SW1. However, according to example embodiments, the diode DD1 may be included in the driving circuit part P20 rather than the semiconductor device part P10. When the constant current source CCS1 and the diode DD1 constitute the "constant voltage application unit", a portion (e.g., the constant current source CCS1) of the constant voltage application unit may be included in the driving circuit part P20, and another portion (e.g., the diode DD1) thereof may be included in the semiconductor device part P10. Alternatively, the entire constant voltage application unit (e.g., CCS1 and DD1) may be included in the driving circuit part P20. The driving circuit part P20 may be a driver integrated circuit (IC).

Figure 2A:
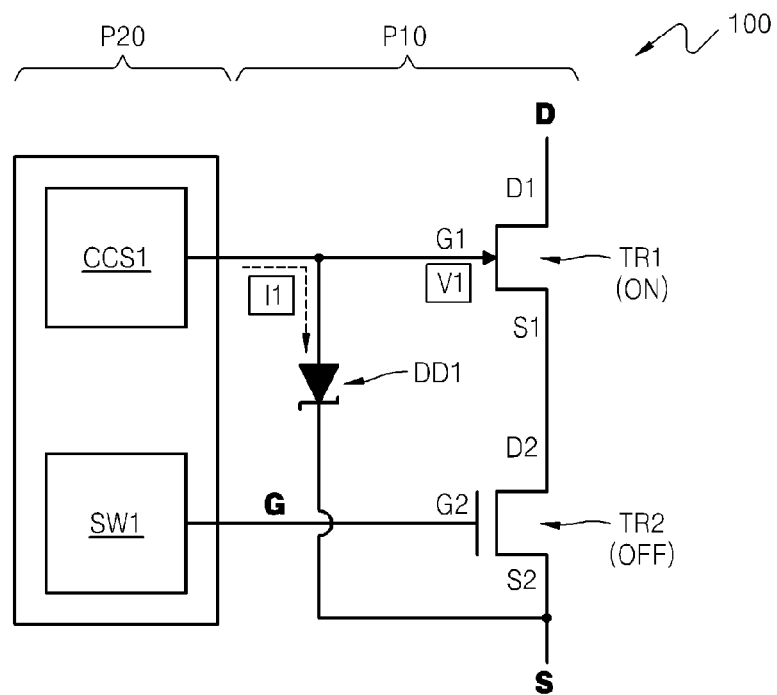
FIGS. 2A and 2B are circuit diagrams for explaining a method of operating the electronic device of FIG. 1 according to example embodiments.
Figure 2B:
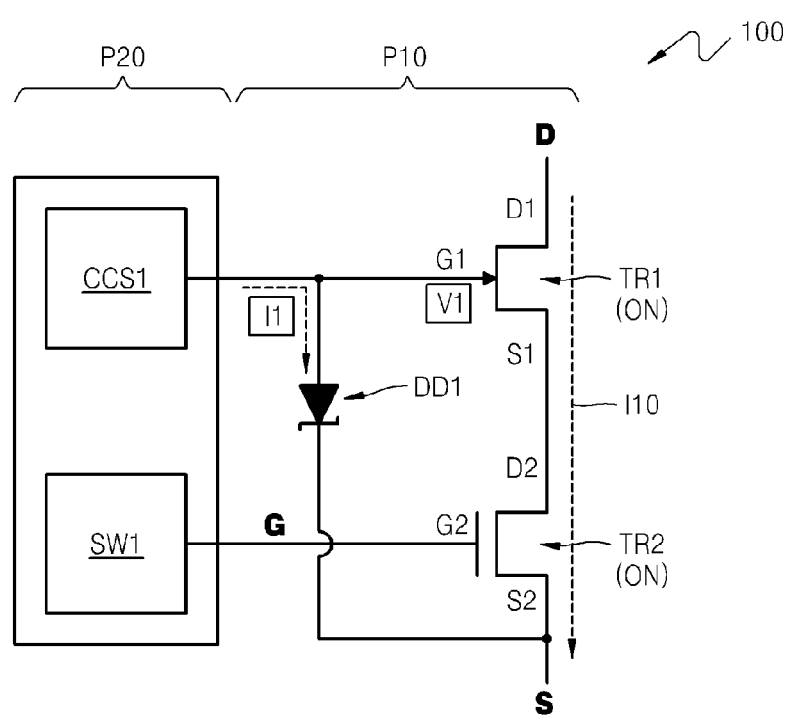

FIGS. 2A and 2B are circuit diagrams for explaining a method of operating the electronic device 100 of FIG. 1 according to example embodiments.

Referring to FIG. 2A, a desired constant voltage V1 may be applied to the gate G1 of the first transistor TR1. The constant voltage V1 may be applied by using the constant current source CCS1 and the diode DD1. If a desired constant current I1 is applied from the constant current source CCS1 to the diode DD1, the diode DD1 is turned on, and thus the constant voltage V1 corresponding to a turn-on voltage (or a forward direction voltage drop) of the diode DD1 may be applied to the gate G1 of the first transistor TR1.

Referring to FIG. 2B, in a state where the constant voltage V1 is applied to the gate G1 of the first transistor TR1, the second transistor TR2 may be turned on by using the switching unit SW1. If a desired voltage is applied between the drain D1 of the first transistor TR1 and the source S2 of the second transistor TR2, a desired current I10 may flow from the drain D1 to the source S2 via the first and second transistors TR1 and TR2. As described above, if the constant voltage V1 is applied to the gate G1 of the first transistor TR1, a voltage between the gate G1 and the source S1 of the first transistor TR1, i.e. the voltage Vgs, may increase as much as the constant voltage V1, and consequently, an on-resistance of the first transistor TR1 may be reduced. For example, the voltage Vgs may increase from a negative (−) value close to 0V to a positive (+) value between about 1 V and about 2 V or a range beyond 2 V, so that the on-resistance of the first transistor TR1 may be reduced. Thus, performance and operating characteristics a device (i.e. the cascode device CD1 of FIG. 1) including the first transistor TR1 and the second transistor TR2 may be improved.

Figure 3:
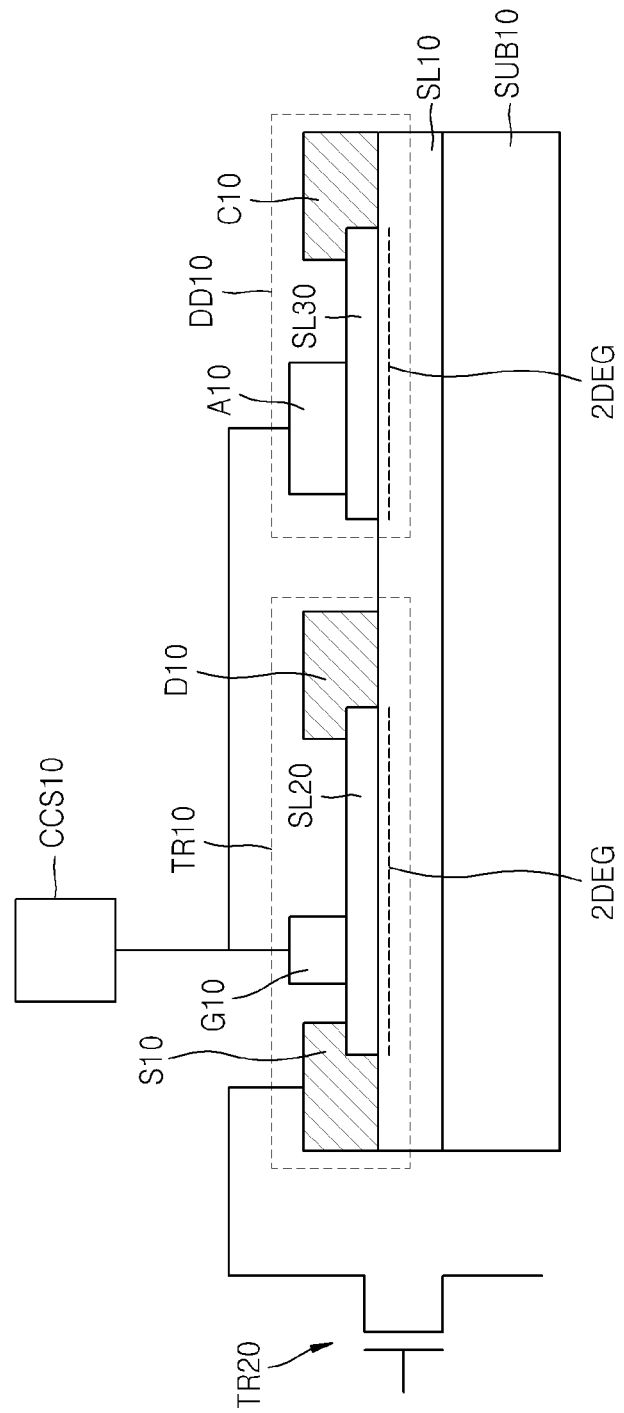
FIG. 3 is a cross-sectional view of an example stack structure of a first transistor and a diode of the electronic device of FIG. 1 according to example embodiments.

FIG. 3 is a cross-sectional view of an example stack structure of the first transistor TR1 and the diode DD1 of the electronic device 100 of FIG. 1 according to example embodiments.

Referring to FIG. 3, a first semiconductor layer SL10 including a first semiconductor material may be disposed on a substrate SUB10. The substrate SUB10 may include, for example, sapphire, silicon (Si), silicon carbide (SiC), sapphire, or gallium nitride (GaN). However, example embodiments are not limited thereto, and the material of the substrate SUB10 may be modified in various ways. The first semiconductor layer SL10 may include a group III-V compound semiconductor material (the first semiconductor material). For example, the first semiconductor layer SL10 may be a gallium nitride based material layer (for example, GaN). The first semiconductor layer SL10 may be an undoped GaN layer, or a GaN layer doped with desired impurities if necessary. Although not shown, a buffer layer may be further disposed between the substrate SUB10 and the first semiconductor layer SL10. The buffer layer reduces (and/or prevents) crystallinity of the first semiconductor layer SL10 from being deteriorated by reducing a difference between the substrate SUB10 and the first semiconductor layer SL10 in terms of a lattice constant and a thermal expansion coefficient. The buffer layer may have a single-layer or a multi-layer structure including at least one nitride that includes at least one of aluminium (Al), gallium (Ga), indium (In), and boron (B). For example, the buffer layer may have the single-layer or the mufti-layer structure including at least one of AlN, GaN, AlGaN, InGaN, AlInN, and AlGaInN.

A second semiconductor layer SL20 including a second semiconductor material may be disposed on a first region of the first semiconductor layer SL10. The second semiconductor layer SL20 may be a material layer that induces a two-dimensional electron gas (2DEG) in the first semiconductor layer SL10. For example, the second semiconductor layer SL20 may be formed of a material (the second semiconductor material) that includes a 2DEG in the first semiconductor layer SL10. The 2DEG may be formed in the first semiconductor layer SL10 under an interface between the first semiconductor layer SL10 and the second semiconductor layer SL20. The second semiconductor layer SL20 may include a material (the second semiconductor material) having different polarization characteristics, energy bandgap and/or lattice constant from those of the first semiconductor layer SL10. The second semiconductor layer SL20 may include a material having a polarizability and/or energy bandgap that is greater than that of the first semiconductor layer SL10. For example, the second semiconductor layer SL20 may have a single-layer or a multi-layer structure including at least one nitride that including at least one of aluminium (Al), gallium (Ga), indium (In), and boron (B). As a specific example, the second semiconductor layer SL20 may have the single-layer or the multi-layer structure including at least one of AlGaN, AlInN, InGaN, AlN, and AlInGaN. The second semiconductor layer SL20 may be an undoped layer, or may be a layer doped with desired impurities. A thickness of the second semiconductor layer SL20 may be less than several tens of nm. For example, a thickness of the second semiconductor layer SL20 may be less than about 50 nm.

A gate electrode G10 may be disposed on the second semiconductor layer SL20. A source electrode S10 and a drain electrode D10 spaced apart from the gate electrode G10 may be provided. The source electrode S10 and the drain electrode D10 may be electrically connected to the 2DEG. The source electrode S10 may be closer to the gate electrode G10 than the drain electrode D10. In other words, a distance between the source electrode S10 and the gate electrode G10 may be shorter than that between the drain electrode D10 and the gate electrode G10. However, this is an example, and the relative distances between the source electrode S10 and the gate electrode G10 and between the drain electrode D10 and the gate electrode G10 may be different. The source electrode S10 and the drain electrode D10 may contact the second semiconductor layer SL20 and may extend onto the first semiconductor layer SL1D. For example, the source electrode S10 and the drain electrode D10 may contact the second semiconductor layer SL20 and the first semiconductor layer SL10. Also, the source electrode S10 and the drain electrode D10 may extend inside the first semiconductor layer SL10. The source electrode S10 and the drain electrode D10 may directly contact the 2DEG.

The first semiconductor layer SL10, the second semiconductor layer SL20, the gate electrode G10, the source electrode S10, and the drain electrode D10 may constitute a first transistor TR10. The first transistor TR10 may correspond to the first transistor TR1 of FIG. 1.

A third semiconductor layer SL30 may be disposed on a second region of the first semiconductor layer SL10. The third semiconductor layer SL30 may include the same material as that of the second semiconductor layer SL20. Thus, the 2DEG may be formed in the first semiconductor layer SL10 contacting the third semiconductor layer SL30. An anode A10 may contact the third semiconductor layer SL30. The anode A10 may be on the third semiconductor layer SL30, and may form a Schottky contact with the third semiconductor layer SL30. The anode A10 may be formed of the same material as that of the gate electrode G10. However, the anode A10 may be formed of a different material from the gate electrode G10. A cathode C10 may be spaced apart from the anode AI10. The cathode C10 may contact the third semiconductor layer SL30. The cathode C10 may contact the third semiconductor layer SL30 while contacting the first semiconductor layer SL10 under the third semiconductor layer SL30. The cathode C10 may be formed of the same material as those of the source electrode S10 and the drain electrode D10. However, the cathode C10 may be formed of a different material from the source electrode S10 and the drain electrode D10.

The third semiconductor layer SL30, the anode A10, and the cathode C10 may constitute a diode DD10. The diode DD10 may correspond to the diode DD1 of FIG. 1. The anode A10 of the diode DD10 may be connected to the gate electrode G10 of the first transistor TR10.

A second transistor TR20 may be provided to be connected to the first transistor TR10. The second transistor TR20 may be the second transistor TR2 described with reference to FIG. 1. For example, the second transistor TR20 may be an enhancement mode (E-mode) transistor having a normally-off characteristic. The second transistor TR20 may be a FET, such as a MOSFET. As a specific example, the second transistor TR20 may be a silicon (Si) based power MOSFET. The second transistor TR20 may be formed on a substrate different from the substrate SUB10 and may be connected to the first transistor TR10 at a packaging step.

A constant current source CCS10 may be connected to the gate electrode G10 of the first transistor TR10. The constant current source CCS10 may be connected to the anode A10 of the diode DD10. The constant current source CCS10 may correspond to the constant current source CCS1 of FIG. 1.

The example stack structure of FIG. 3 may be modified in various ways. For example, a gate insulation layer may be further disposed between the gate electrode G10 and the second semiconductor layer SL20, as shown in FIG. 4.

Figure 4:
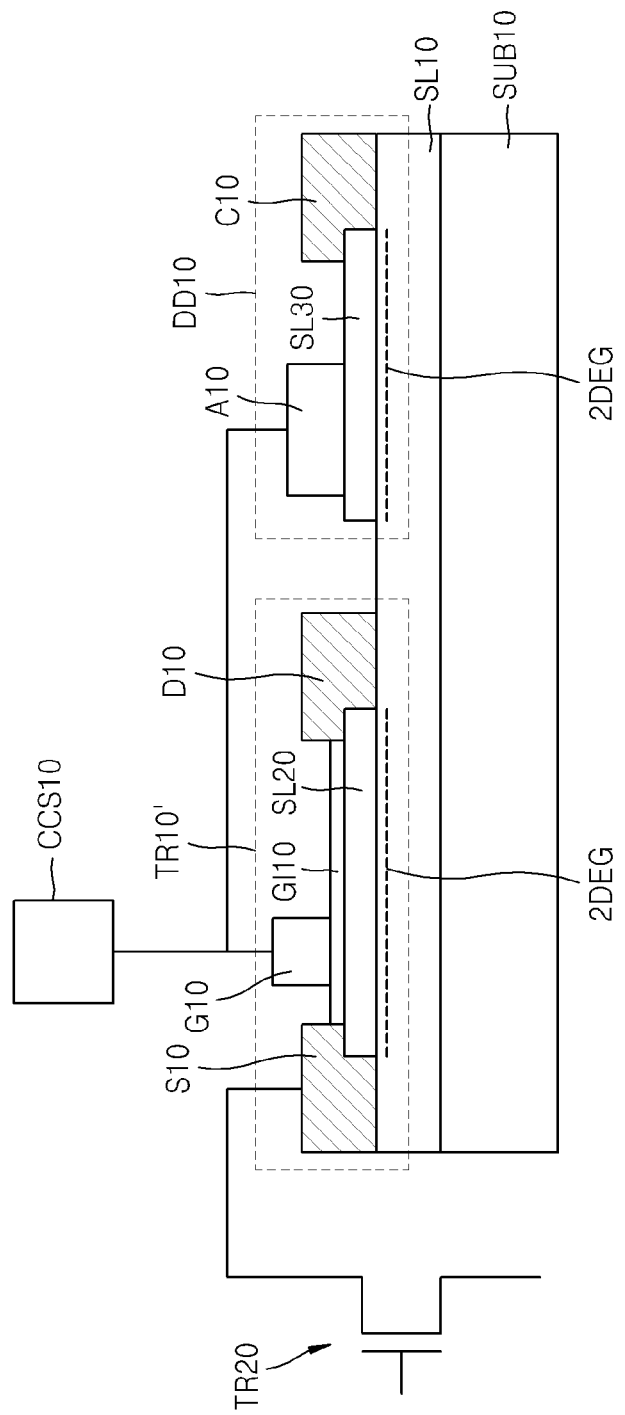
FIG. 4 is a cross-sectional view of an example stack structure of a first transistor and a diode of the electronic device of FIG. 1 according to example embodiments.

Referring to FIG. 4, a first transistor TR10' may further include a gate insulating layer GI10 disposed between the gate electrode G10 and the second semiconductor layer SL20. The gate insulating layer GI10 may include at least one of, for example, $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and a combination thereof. Although not disclosed, as long as an insulating material is used for a general transistor, the insulating material may be used as a material for the gate insulating layer G10. The first transistor TR10' of may be a metal-insulator-semiconductor (MIS) type HEMT.

Although a case where the first transistors TR10 and TR10' and the diode DD10 are disposed on the same substrate SUB10 is illustrated and described with reference to FIGS. 3 and 4, example embodiments are not limited thereto. For example, the first transistors TR10 and TR10' and the diode DD10 may be disposed on different substrates. However, as shown in FIGS. 3 and 4, if the first transistors TR10 and TR10' and the diode DD10 are disposed on the same substrate SUB10, a processing load may be reduced, and productivity may be improved.

The configuration of the constant current source CCS1 of FIG. 1 will be described in more detail below. The configuration of the constant current source CCS1 of FIG. 1 may be identical or similar to that of an apparatus used to generate a constant current in a variety of electronic circuits, e.g., such as a constant current generator. The constant current source CCS1 may have various configurations.

Figure 5:
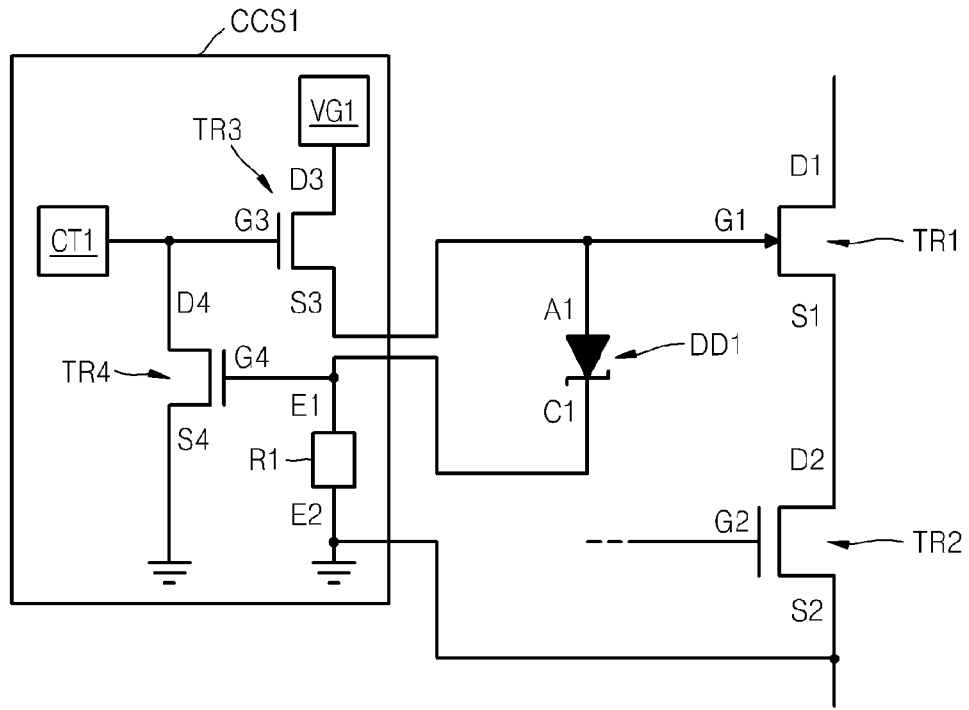
FIG. 5 is a circuit diagram of a configuration of a constant current source of FIG. 1 according to example embodiments.

FIG. 5 is a circuit diagram of a configuration of the constant current source CCS1 of FIG. 1, according to example embodiments. An example of the configuration of the constant current source CCS1 and a connection relationship between the constant current source CCS1 and the first and second transistors TR1 and TR2 is shown in FIG. 5.

Referring to FIG. 5, the constant current source CCS1 may include a voltage generator VG1 and at least one transistor, for example, two transistors TR3 and TR4. Hereinafter, one of the two transistors TR3 and TR4 is referred to as the third transistor TR3, and another is referred to as the fourth transistor TR4. A drain D3 of the third transistor TR3 may be connected to the voltage generator VG1, and a source S3 of the third transistor TR3 may be connected to the gate G1 of the first transistor TR1 and the diode DD1. A gate G3 of the third transistor TR3 may be connected to a drain D4 of the fourth transistor TR4. A source S4 of the fourth transistor TR4 may be grounded. The constant current source CCS1 may further include a resistor R1. A first end E1 of the resistor R1 may be connected to the cathode C1 of the diode DD1. A second end E2 of the resistor R1 may be grounded. The second end E2 of the resistor R1 may be connected to the source S2 of the second transistor TR2. Thus, the cathode C1 of the diode DD1 may be considered to be connected to the source S2 of the second transistor TR2 via the resistor R1. A gate G4 of the fourth transistor TR4 may be connected to the first end E1 of the resistor R1. A controller CT1 may be connected to the gate G3 of the third transistor TR3 and the drain D4 of the fourth transistor TR4. The controller CT1 may adjust a signal (a voltage) applied to the gate G3 of the third transistor TR3. The controller CT1 may be connected to the voltage generator VG1.

By applying a voltage to the drain D3 of the third transistor TR3 from the voltage generator VG1, a current may be applied to the diode DD1 via the third transistor TR3. The controller CT1 may sense a voltage applied to the resistor R1 and adjust a voltage applied to the gate G3 of the third transistor TR3. As a result, the current applied to the diode DD1 via the third transistor TR3 may be maintained constant. For example, a "constant voltage" may be applied to the diode DD1 via the third transistor TR3.

The configuration of the constant current source CCS1 of FIG. 5 may be modified in various ways.

The above-described configuration of the electronic device 100 may be modified in various ways. As an example, a plurality of diodes may be connected to the gate G1 of the first transistor TR1, as shown in FIG. 6.

Figure 6:
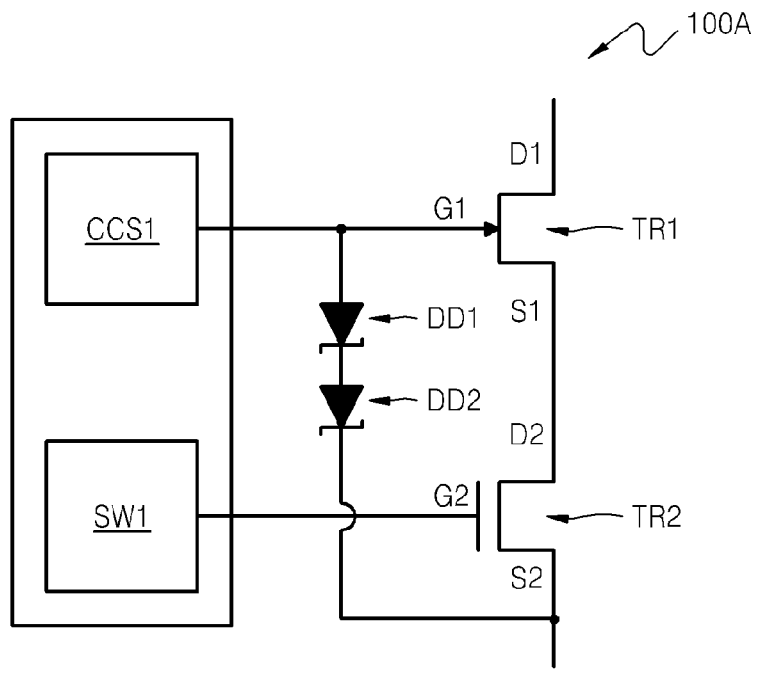
FIG. 6 is a circuit diagram of an electronic device according to example embodiments.

Referring to FIG. 6, an electronic device 100A may include a plurality of diodes DD1 and DD2 connected to the gate G1 of the first transistor TR1. The plurality of diodes DD1 and DD2 may be connected in series to the gate G1. Although a case where the two diodes DD1 and DD2 are connected to the gate G1 is shown in FIG. 6, three or more diodes may be used. In example embodiments, a voltage drop effect of two diodes DD1 and DD2 is twice that of a single diode being used (FIG. 1), and thus a constant voltage applied to the gate G1 may increase. Therefore, an on-resistance of the first transistor TR1 may be further reduced, and performance and operating characteristic of the electronic device 100A may be further improved. Except for using two diodes DD1 and DD2, the configuration of FIG. 6 may be the same as that of FIG. 1.

Electronic devices according to example embodiments may be applied to, for example, a power device. Power devices having a normally-off characteristic, a low on-resistance, and an excellent operating characteristic may be obtained. However, an application field of the electronic devices according to example embodiments is not limited to the power device and may be modified in various ways.

It should be understood that the example embodiments described therein should be considered in a descriptive sense only and not for purposes of limitation. Descriptions of features or aspects within each electronic device according to example embodiments should typically be considered as available for other similar features or aspects in other electronic devices according example embodiments. For example, it will be understand by one of ordinary skill in the art that the "constant voltage application unit" of FIGS. 1 through 6 may have a configuration other than a combination of the constant current sources CCS1 and CCS10 and the diodes DD1, DD2, and DD10. Also, the structures of the first transistors TR1, TR10, and TR10', the second transistors TR2 and TR20, and the diodes DD1, DD2, and DD10 and materials thereof may be modified in various ways. The operating method described with reference to FIGS. 2A and 2B may also be modified. In addition, it will be understand by one of ordinary skill in the art that the idea of example embodiments may be applied to a device other than a power device.

While some example embodiments have been particularly shown and described, it will be understood by one of ordinary skill in the art that various changes in form and details may be made therein without departing from the spirit and scope of the example embodiments as defined by the following claims.

What is claimed is:

1. An electronic device comprising:
a first transistor having a normally-on characteristic;
a second transistor connected to the first transistor, the second transistor having a normally-off characteristic, the second transistor having a source;
a constant voltage application unit configured to apply a constant voltage to a gate of the first transistor, the constant voltage application unit being between the gate of the first transistor and the source of the second transistor; and
a switching unit configured to apply a switching signal to the second transistor,
wherein the constant voltage application unit includes,
a constant current source connected to the gate of the first transistor, and including a voltage generator and at least one third transistor, and
a diode connected between the constant current source and the gate of the first transistor, and
wherein the electronic device is configured to apply the constant voltage to the gate of the first transistor by using the constant current source and the diode, the constant voltage corresponding to a forward direction voltage drop of the diode.

2. The electronic device of claim 1, wherein the first transistor is a high electron mobility transistor (HEMT).

3. The electronic device of claim 2, wherein the first transistor is a nitride based HEMT.

4. The electronic device of claim 3, wherein the first transistor includes a gallium nitride based material.

5. The electronic device of claim 1, wherein the second transistor is a metal-oxide-semiconductor field-effect transistor (MOSFET).

6. The electronic device of claim 5, wherein the second transistor is a silicon (Si) based MOSFET.

7. The electronic device of claim 1, wherein the first transistor and the second transistor are connected to each other in a cascode configuration.

8. The electronic device of claim 1, wherein,
an anode of the diode is connected to the gate of the first transistor, and
a cathode of the diode is connected to the source of the second transistor.

9. The electronic device of claim 1, wherein the diode is a Schottky diode.

10. The electronic device of claim 1, wherein a semiconductor material of the diode is the same as a semiconductor material of the first transistor.

11. The electronic device of claim 1, wherein the diode includes a gallium nitride based material.

12. The electronic device of claim 1, further comprising:
a substrate,
wherein the diode and the first transistor are on the substrate.

13. The electronic device of claim 12, wherein the first transistor includes:
a first semiconductor layer formed of a first semiconductor material on the substrate;
a second semiconductor layer on a first region of the first semiconductor layer and formed of a second semiconductor material that induces a two-dimensional electron gas (2DEG) in the first semiconductor layer;
the gate on the second semiconductor layer; and
a source and a drain at both sides of the gate, and
wherein the diode includes,
a third semiconductor layer on a second region of the first semiconductor layer and formed of the second semiconductor material;
an anode forming a Schottky contact with the third semiconductor layer; and
a cathode spaced apart from the anode.

14. The electronic device of claim 1, wherein
the constant voltage application unit includes a plurality of diodes, and
the plurality of diodes of the constant voltage application unit are connected between the constant current source of the constant voltage application unit and the gate of the first transistor.

15. The electronic device of claim 1, wherein,
the electronic device includes a semiconductor device part and a driving circuit part,
the semiconductor device part includes the first and second transistors, and the driving circuit part includes the switching unit and at least a portion of the constant voltage application unit.

16. The electronic device of claim 15, wherein,
the constant current source is included in the driving circuit part, and
the diode is included in the semiconductor device part.

17. The electronic device of claim 15, wherein,
the constant current source and the diode are included in the driving circuit part.

18. A power device including the electronic device of claim 1.

19. An electronic device comprising:
a HEMT having a normally-on characteristic;
a FET connected to the HEMT, the FET having a normally-off characteristic, the FET having a source;
a constant current source connected to a gate of the HEMT, and including a voltage generator and at least one transistor;
a diode connected between the constant current source and the gate of the HEMT; and
a switching unit configured to apply a switching signal to the FET, wherein
the electronic device is configured to apply a constant voltage to the gate of the HEMT by using the constant current source and the diode, the constant voltage corresponding to a forward direction voltage drop of the diode.

20. The electronic device of claim 19, wherein the HEMT includes a gallium nitride based material.

21. The electronic device of claim 19, wherein the diode includes a gallium nitride based material.

22. The electronic device of claim 19, further comprising:
a substrate,
wherein the HEMT and the diode are on the substrate.

23. The electronic device of claim 19, wherein the FET is a silicon (Si) based MOSFET.

24. The electronic device of claim 19, wherein the HEMT and the FET are connected to each other in a cascode configuration.

25. A method of operating an electronic device including a first transistor having a normally-on characteristic and a second transistor connected to the first transistor and having a normally-off characteristic, the method comprising:
applying a constant voltage to a gate of the first transistor to increase a voltage between the gate and a source of the first transistor, the constant voltage being applied to the gate of the first transistor by a constant voltage application unit, the constant voltage application unit being between the gate of the first transistor and a source of the second transistor, and the constant voltage application unit including,
a constant current source connected to the gate of the first transistor, and including a voltage generator and at least one third transistor, and
a diode connected between the constant current source and the gate of the first transistor; and
applying a switching signal to the second transistor while the constant voltage is applied to the gate of the first transistors;
wherein the constant voltage is applied to the gate of the first transistor using the constant current source and the diode; and
wherein the constant voltage corresponds to a forward direction voltage drop of the diode.

26. The method of claim 25, wherein
the applying the constant voltage includes applying the constant voltage to the gate of the first transistor by using the constant current source and the diode.

27. The method of claim 25, wherein
an anode of the diode is connected to the gate of the first transistor, and
a cathode of the diode is connected to the source of the second transistor.

28. The method of claim 25, wherein the diode is a Schottky diode.

29. The method of claim 25, wherein the first transistor is a HEMT.

30. The method of claim 25, wherein the second transistor is a MOSFET.

31. The method of claim 25, wherein the first transistor and the second transistor are connected to each other in a cascode configuration.

32. An electronic device comprising:
a first transistor connected to a second transistor, the first transistor having a normally-on characteristic, and the second transistor having a normally-off characteristic; and
a driving circuit, the driving circuit being configured to apply a constant voltage to a gate of the first transistor using a constant voltage application unit, and the driving circuit being configured to apply a switching signal to a gate of the second transistor,
wherein the constant voltage application unit is provided between the gate of the first transistor and a source of the second transistor, and
wherein the constant voltage application unit includes,
a constant current source connected to the gate of the first transistor, and including a voltage generator and at least one third transistor, and
a diode connected between the constant current source and the gate of the first transistor,
wherein the electronic device is configured to apply the constant voltage to the gate of the first transistor by using the constant current source and the diode, the constant voltage corresponding to a forward direction voltage drop of the diode.

33. The electronic device of claim 32, wherein
the first transistor is a high electron mobility transistor (HEMT),
the second transistor is a metal-oxide semiconductor field-effect transistor (MOSFET), and
the first transistor and the second transistor are connected to each other in a cascode configuration.

34. The electronic device of claim 32, wherein
the constant current source is connected to an anode of the diode and the gate of the first transistor,
a cathode of the diode is connected to a source of the second transistor, and
the driving circuit further includes a switching unit that is connected to a gate of the second transistor.

35. The electronic device of claim 32, wherein the diode and the first transistor are on a common substrate.

36. The electronic device of claim 32, wherein the diode is a Schottky diode.

* * * * *